(12) United States Patent
Doi (10) Patent No.: US 8,479,704 B2
(45) Date of Patent: Jul. 9, 2013

(54) SLIDING COMPONENT FOR INTERNAL COMBUSTION ENGINE, INTERNAL COMBUSTION ENGINE, TRANSPORTER, AND METHOD FOR PRODUCING THE SLIDING COMPONENT FOR INTERNAL COMBUSTION ENGINE

(75) Inventor: Kosuke Doi, Shizuoka (JP)

(73) Assignee: Yamaha Hatsudoki Kabushiki Kaisha, Shizuoka (JP)

( * ) Notice: Subject to any disclaimer, the term of this patent is extended or adjusted under 35 U.S.C. 154(b) by 703 days.

(21) Appl. No.: 12/637,904

(22) Filed: Dec. 15, 2009

(65) Prior Publication Data
US 2010/0275875 A1 Nov. 4, 2010

(30) Foreign Application Priority Data
Apr. 30, 2009 (JP) ................. 2009-110608

(51) Int. Cl.
*F02B 75/32* (2006.01)
(52) U.S. Cl.
USPC ......... 123/197.3; 428/472; 428/336; 148/284
(58) Field of Classification Search
USPC ............... 123/197.3; 428/457, 332, 472, 335, 428/336; 148/284
See application file for complete search history.

(56) References Cited

U.S. PATENT DOCUMENTS
4,974,498 A * 12/1990 Lemelson ...................... 92/223
5,989,397 A * 11/1999 Laube et al. ............. 204/298.03

2006/0169239 A1 8/2006 Tominaga et al.
2006/0182895 A1 8/2006 Denul et al.
2006/0243237 A1 11/2006 Matsuda et al.

FOREIGN PATENT DOCUMENTS
| EP | 0 244 253 A1 | 11/1987 |
|---|---|---|
| EP | 1 798 305 A1 | 6/2007 |
| JP | 56-066525 U | 10/1979 |
| JP | 2002-327732 A | 11/2002 |
| JP | 2002-372029 A | 12/2002 |
| JP | 2006-207490 A | 8/2006 |
| JP | 2006-257942 A | 9/2006 |
| JP | 2007-32558 A | 2/2007 |
| WO | 96/04485 A1 | 2/1996 |

OTHER PUBLICATIONS

Monaghan, Materials World, vol. 1, No. 6 pp. 347-349, Jun. 1993.*
Mikuni et al JP-2002327732 Machine Translation.*
Official Communication issued in corresponding Japanese Patent Application No. 2009-110608, mailed on Dec. 4, 2012.
Official Communication issued in corresponding European Patent Application No. 09179058.4, mailed on Jan. 21, 2013.

* cited by examiner

*Primary Examiner* — Thanh K Truong
*Assistant Examiner* — Ruben Picon-Feliciano
(74) *Attorney, Agent, or Firm* — Keating & Bennett, LLP (57) ABSTRACT

A sliding component for an internal combustion engine includes a component main body made of titanium or a titanium alloy, a surface hardened layer provided on a surface of the component main body, a diamond-like carbon film provided on the surface hardened layer, and a titanium layer provided between the surface hardened layer and the diamond-like carbon film.

13 Claims, 6 Drawing Sheets

COMPARATIVE EXAMPLE

FIG.5

EXAMPLE

SLIDING COMPONENT FOR INTERNAL COMBUSTION ENGINE, INTERNAL COMBUSTION ENGINE, TRANSPORTER, AND METHOD FOR PRODUCING THE SLIDING COMPONENT FOR INTERNAL COMBUSTION ENGINE

BACKGROUND OF THE INVENTION

1. Field of the Invention

The present invention relates to a sliding component for an internal combustion engine, and specifically to a sliding component formed of titanium or a titanium alloy. The present invention also relates to an internal combustion engine and a transporter including such a sliding component, and a method for producing the sliding component.

2. Description of the Related Art

Recently, titanium alloys have become increasingly used as a material for a component for an internal combustion engine, especially for a component making a reciprocating motion such as a connecting rod, a lifter, a valve or the like, for the purpose of decreasing the weight thereof. Titanium alloys, although being lightweight, have a high activity and thus have a low seizure resistance. Titanium alloys are less hard than steel and thus have a lower abrasion resistance. Therefore, a component formed of a titanium alloy is treated with surface hardening such as, for example, oxidation, nitrification, carbonization or the like. As a result of surface hardening, a surface hardened layer is formed on a surface of the component and thus the seizure resistance and the abrasion resistance are improved.

For using a component formed of a titanium alloy as a sliding component that is slidable while being in contact with another component, it is preferable that the surface of the component has the lowest possible coefficient of friction. For this purpose, it is proposed to form a diamond-like carbon (DLC) layer having a low coefficient of friction on the surface hardened layer. For example, Japanese Laid-Open Patent Publication No. 2006-257942 discloses a technology of treating a surface of a titanium alloy tappet with carburizing as surface hardening to form a carbide layer and then forming a DLC film on the carbide layer (surface hardened layer).

However, formation of a DLC film on the surface hardened layer has the following problem. The surface hardened layer such as a carbide layer, an oxide layer or the like is a ceramic layer, and thus has a low adhesiveness to the DLC film. Therefore, the DLC film is likely to be delaminated when the component receives an impact, and thus has a low impact resistance.

Japanese Laid-Open Patent Publication No. 2006-257942 describes that the adhesiveness of the DLC film to the carbide layer is improved by removing an oxide cover layer formed on a surface of the carbide layer before forming the DLC film. However, the research conducted by the present inventor revealed that a sufficiently high adhesiveness or impact resistance cannot be provided even by the method described in Japanese Laid-Open Patent Publication No. 2006-257942.

SUMMARY OF THE INVENTION

In order to overcome the problems described above, preferred embodiments of the present invention improve the adhesiveness of a DLC film provided on a surface of a sliding component formed of titanium or a titanium alloy to realize a high impact resistance.

A sliding component for an internal combustion engine according to a preferred embodiment of the present invention includes a component main body made of titanium or a titanium alloy, a surface hardened layer provided on a surface of the component main body, a diamond-like carbon film provided on the surface hardened layer, and a titanium layer or a titanium alloy layer provided between the surface hardened layer and the diamond-like carbon film.

In a preferred embodiment, the titanium layer or the titanium alloy layer has a thickness of about 100 nm or greater and about 1,500 nm or less, for example.

In a preferred embodiment, the surface hardened layer is a titanium oxide layer.

In a preferred embodiment, the surface hardened layer has a thickness of about 50 μm or greater and about 150 μm or less, for example.

In a preferred embodiment, the diamond-like carbon film has a thickness of about 1 μm or greater and about 6 μm or less, for example.

In a preferred embodiment, the sliding component for an internal combustion engine according to the present invention further includes at least one intermediate layer provided between the titanium layer or the titanium alloy layer and the diamond-like carbon film.

In a preferred embodiment, the intermediate layer is a chromium layer, a silicon layer or a tungsten layer. Alternatively, the intermediate layer is a DLC gradient layer in which a metal element or a non-metal element and a diamond-like carbon layer are contained and the ratio thereof changes in a thickness direction.

In a preferred embodiment, the sliding component for an internal combustion engine according to the present invention is a connecting rod including a small end section and a large end section, and a connection section arranged to connect the small end section and the large end section to each other.

In a preferred embodiment, the surface hardened layer, the titanium layer or the titanium alloy layer, and the diamond-like carbon film are provided on an inner circumferential surface of at least one of the small end section and the large end section.

In a preferred embodiment, the surface hardened layer, the titanium layer or the titanium alloy layer, and the diamond-like carbon film are provided on a thrust surface of the large end section.

An internal combustion engine according to another preferred embodiment of the present invention includes the sliding component for an internal combustion engine having the above-described structure.

A transporter according to a further preferred embodiment of the present invention includes the internal combustion engine having the above-described structure.

A method for producing a sliding component for an internal combustion engine according to yet another preferred embodiment of the present invention includes the steps of preparing a component main body formed of titanium or a titanium alloy, forming a surface hardened layer on a surface of the component main body, forming a titanium layer or a titanium alloy layer on the surface hardened layer, and forming a diamond-like carbon film on the titanium layer or the titanium alloy layer.

In a preferred embodiment, in the step of forming the titanium layer or the titanium alloy layer, the titanium layer or the titanium alloy layer is formed to have a thickness of about 100 nm or greater and about 1,500 nm or less, for example.

In a preferred embodiment, in the step of forming the surface hardened layer, the surface of the component main body is oxidized to form a titanium oxide layer as the surface hardened layer.

In a preferred embodiment, the method for producing a sliding component for an internal combustion engine according to the present invention further includes the step of removing an outermost portion of the titanium oxide layer before the step of forming the titanium layer or the titanium alloy layer.

In a sliding component for an internal combustion engine according to a preferred embodiment of the present invention, a surface hardened layer is provided on a component main body formed of titanium or a titanium alloy, and a diamond-like carbon film is provided on the surface hardened layer. The surface hardened layer and the diamond-like carbon film provided in this manner improve the seizure resistance and the abrasion resistance of the sliding component and also decrease the coefficient of friction of the surface of the sliding component. Further in the sliding component according to a preferred embodiment of the present invention, a titanium layer or a titanium alloy layer is provided between the surface hardened layer and the diamond-like carbon film. The titanium layer and the titanium alloy layer are highly adhesive to both of the surface hardened layer and the diamond-like carbon film. Therefore, the titanium layer or the titanium alloy layer provided between the surface hardened layer and the diamond-like carbon film improves the adhesiveness of the diamond-like carbon film. This results in a high impact resistance being achieved.

From the viewpoint of providing both of a high impact resistance and a high productivity, it is preferable that the titanium layer or the titanium alloy layer has a thickness of about 100 nm or greater and about 1,500 nm or less, for example. When the thickness is less than about 100 nm, the diamond-like carbon film cannot have a sufficiently high adhesiveness and the impact resistance may not be improved to a sufficiently high level. When the thickness exceeds about 1,500 nm, the time required to form the titanium layer or the titanium alloy layer (formation time) is excessively long and so the productivity may be decreased.

From the viewpoint of the production cost, it is preferable that the surface hardened layer is a titanium oxide layer. The formation of the titanium oxide layer can be conducted in the air and does not require any material gas unlike the formation of a titanium nitride layer or a titanium carbide layer. It is not necessary either to use a plasma CVD apparatus or the like to form the titanium oxide layer. For these reasons, the titanium oxide layer can be produced at low cost.

Preferably, the surface hardened layer has a thickness of about 50 μm or greater and about 150 μm or less, for example. When the thickness is less than about 50 μm, abrasion or seizure may occur due to the shortage of slidability. When the thickness exceeds about 150 μm, the fatigue strength is decreased by the thick embrittled layer and the surface hardened layer may be destroyed.

Preferably, the diamond-like carbon film has a thickness of about 1 μm or greater and about 6 μm or less, for example. When the thickness is less than about 1 μm, abrasion may occur due to the shortage of abrasion resistance. When the thickness exceeds about 6 μm, the diamond-like carbon film may be delaminated due to the shortage of adhesiveness.

The sliding component for an internal combustion engine according to a preferred embodiment of the present invention may further include at least one intermediate layer provided between the titanium layer or the titanium alloy layer and the diamond-like carbon film. The intermediate layer can gradually change physical properties such as the Young's modulus, hardness and the like of the layers above and below the intermediate layer. The intermediate layer can also alleviate the residual stress. Therefore, by providing a preferable intermediate layer, the adhesiveness of the diamond-like carbon film can be further improved and thus a still higher impact resistance can be achieved.

As the intermediate layer, a chromium layer, a silicon layer or a tungsten layer is preferably used, for example. Alternatively, a DLC gradient layer in which a metal element or a non-metal element and a diamond-like carbon layer are contained and the ratio thereof (existing ratio) changes in a thickness direction is also preferably used as the intermediate layer.

The sliding component for an internal combustion engine according to a preferred embodiment the present invention is, for example, a connecting rod. The connecting rod includes a small end section and a large end section, and a connection section arranged to connect the small end section and the large end section to each other. The small end section has a through-hole through which a piston pin can pass, and is connected to a piston. The large end section has a through-hole through which a crankpin can pass, and is connected to a crank shaft.

A stacking structure including the surface hardened layer, the titanium layer or the titanium alloy layer, and the diamond-like carbon film is preferably provided at a portion, of the connecting rod, which is required to have a high slidability characteristic. Specifically, it is preferable that the stacking structure is provided on an inner circumferential surface of at least one of the small end section and the large end section. It is also preferable that stacking structure is provided on a thrust surface of the large end section.

A sliding component according to a preferred embodiment of the present invention is preferably usable in any of various types of internal combustion engines. Use of the sliding component according to a preferred embodiment of the present invention including the component main body formed of titanium or a titanium alloy (i.e., the lightweight sliding component) can decrease the weight of the internal combustion engine. Use of the lightweight sliding component according to a preferred embodiment of the present invention can decrease the inertial force, and so the vibration of the internal combustion engine can be reduced to improve the response. In addition, because the coefficient of friction of the diamond-like carbon film is low, use of the sliding component according to a preferred embodiment of the present invention can reduce the friction loss. This can improve the fuel efficiency and also increase the output. Moreover, the diamond-like carbon film is not very invasive to other components against which the sliding component is slidable. Therefore, use of the sliding component according to a preferred embodiment of the present invention can decrease the wear of such another component and thus improve the durability of the internal combustion engine.

The internal combustion engine including the sliding component according to a preferred embodiment of the present invention is preferably usable for various transportation vehicles including a motorcycle.

With a method for producing a sliding component for an internal combustion engine according to a preferred embodiment of the present invention, the step of forming a titanium layer or a titanium alloy layer is carried out between the step of forming a surface hardened layer and the step of forming a diamond-like carbon film. Therefore, according to the production method of a preferred embodiment of the present invention, a sliding component for an internal combustion engine including a titanium layer or a titanium alloy layer between the surface hardened layer and the diamond-like carbon film is obtained. The titanium layer and the titanium alloy layer are highly adhesive to both of the surface hardened layer and the diamond-like carbon film. Therefore, the titanium layer or the titanium alloy layer provided between the surface hardened layer and the diamond-like carbon film improves the adhesiveness of the diamond-like carbon film. This results in a high impact resistance being achieved.

From the viewpoint of providing both of a high impact resistance and a high productivity, it is preferable that in the step of forming the titanium layer or the titanium alloy layer, the titanium layer or the titanium alloy layer is formed to have a thickness of about 100 nm or greater and about 1,500 nm or less, for example. When the thickness is less than about 100 nm, the diamond-like carbon film cannot have a sufficiently high adhesiveness and the impact resistance may not be improved to a sufficiently high level. When the thickness exceeds about 1,500 nm, the time required to form the titanium layer or the titanium alloy layer (formation time) is excessively long and so the productivity may be decreased.

From the viewpoint of the production cost, it is preferable that in the step of forming the surface hardened layer, the surface of the component main body is oxidized to form a titanium oxide layer as the surface hardened layer. The formation of the titanium oxide layer can be conducted in the air and does not require any material gas unlike the formation of a titanium nitride layer or a titanium carbide layer. It is not necessary either to use a plasma CVD apparatus or the like to form the titanium oxide layer. For these reasons, the titanium oxide layer can be produced at low cost.

When the titanium oxide layer is formed as the surface hardened layer, it is preferable to carry out the step of removing an outermost portion of the titanium oxide layer before the step of forming the titanium layer or the titanium alloy layer. The outermost portion of the titanium oxide layer is a brittle portion called an "oxide scale". By removing this portion, the adhesiveness of the titanium layer or the titanium alloy layer to the surface hardened layer (titanium oxide layer) can be further improved.

According to various preferred embodiments of the present invention, the adhesiveness of a DLC film provided on a surface of a sliding component formed of titanium or a titanium alloy is improved to realize a high impact resistance.

Other elements, features, steps, characteristics and advantages of the present invention will become more apparent from the following detailed description of the preferred embodiments with reference to the attached drawings.

DETAILED DESCRIPTION OF PREFERRED EMBODIMENTS

Hereinafter, preferred embodiments of the present invention will be described with reference to the accompanying drawings. In the following, a connecting rod will be described as an example, but the present invention is not limited to a connecting rod and is preferably applicable widely to any sliding component for an internal combustion engine.

Figure 1:
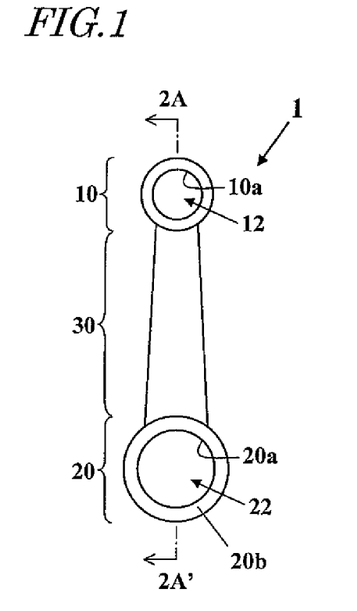
FIG. 1 is a plan view schematically showing a connecting rod 1 according to a preferred embodiment of the present invention.
Figure 2:
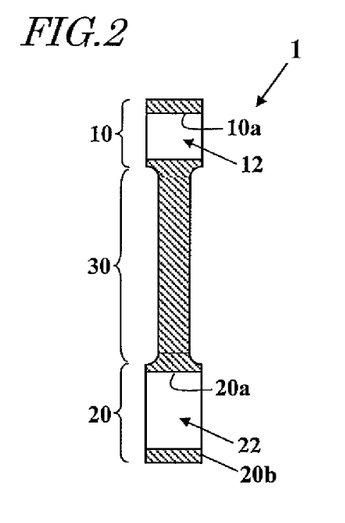
FIG. 2 is a cross-sectional view schematically showing the connecting rod 1 according to a preferred embodiment of the present invention.

FIG. 1 and FIG. 2 show a connecting rod 1 in this preferred embodiment. FIG. 1 is a plan view schematically showing the connecting rod 1, and FIG. 2 is a cross-sectional view of the connecting rod 1 taken along line 2A-2A' of FIG. 1.

The connecting rod 1 is formed of titanium or a titanium alloy. As shown in FIG. 1 and FIG. 2, the connecting rod 1 includes a small end section 10, a large end section 20, and a connection section 30 arranged to connect the small end section 10 and the large end section 20 to each other.

The connection section 30 preferably has a rod-shaped configuration. The small end section 10 is provided at one end of the connection section 30, and the large end section 20 is provided at the other end of the connection section 30. In the small end section 10, a through-hole 12 through which a piston pin can pass (referred to as a "piston pin hole") is formed. In the large end section 20, a through-hole 22 through which a crankpin can pass (referred to as a "crankpin hole") is formed.

Figure 3:
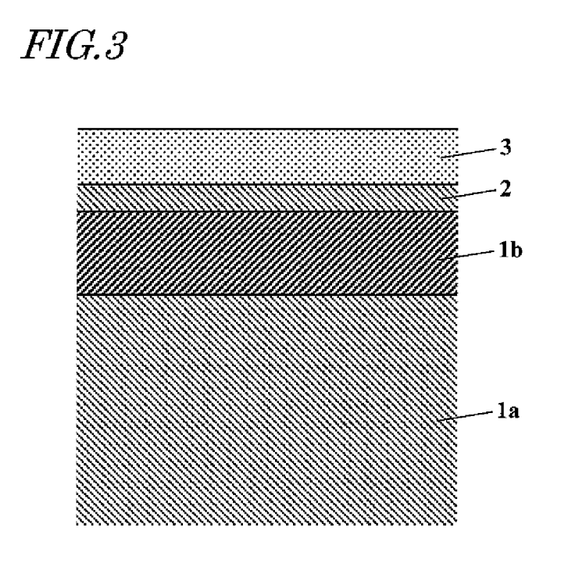
FIG. 3 is a cross-sectional view schematically showing a stacking structure located at a slide contact portion of the connecting rod 1 according to a preferred embodiment of the present invention.

An inner circumferential surface 10a of the small end section 10, an inner circumferential surface 20a of the large end section 20, and a thrust surface 20b of the large end section 20 may be in sliding contact with another component. In this preferred embodiment, at least one (preferably, all) of these portions (slide contact portions) has a stacking structure including a diamond-like carbon (DLC) layer. Hereinafter, with reference to FIG. 3, this stacking structure will be described more specifically. FIG. 3 is a cross-sectional view schematically showing the stacking structure formed at a slide contact portion.

The stacking structure shown in FIG. 3 includes a component main body 1a, a surface hardened layer 1b, a titanium layer 2 and a DLC film 3. The component main body 1a, the surface hardened layer 1b, the titanium layer 2 and the DLC film 3 are stacked in this order from the inner side of the connecting rod 1.

The component main body (the main body of the connecting rod) 1a is formed of titanium or a titanium alloy. More specifically, the component main body 1a is formed of pure titanium or an alloy of titanium and another metal element.

The surface hardened layer 1b is formed on a surface of the component main body 1a. The surface hardened layer 1b is formed by hardening processing and is harder than the component main body 1a. Specifically, the surface hardened layer 1b is a titanium oxide layer, a titanium nitride layer, a titanium carbide layer or the like.

The titanium layer 2 is provided between the surface hardened layer 1b and the DLC film 3. The titanium layer 2 is preferably provided directly on the surface hardened layer 1b (with no other layer sandwiched between surface hardened layer 1b and the titanium layer 2).

The DLC film 3 is a hard carbon film having an amorphous structure, and is provided on the titanium layer 2. The DLC film 3 is provided on the titanium layer 2. More specifically, the DLC film 3 is provided on the surface hardened layer 1b with the titanium layer 2 interposed therebetween.

As described above, in this preferred embodiment, the surface hardened layer 1b is formed on the surface of the component main body 1a formed of titanium or a titanium alloy, and the DLC film 3 is provided on the surface hardened layer 1b. The surface hardened layer 1b and the DLC film 3 constructed and arranged in this manner improve the seizure resistance and the abrasion resistance of the connecting rod 1 and also decrease the coefficient of friction of the surface of the connecting rod 1. Further in this preferred embodiment, the titanium layer 2 is preferably provided between the surface hardened layer 1b and the DLC film 3. The titanium layer 2 is highly adhesive to both of the surface hardened layer 1b and the DLC film 3. Therefore, the titanium layer 2 provided between the surface hardened layer 1b and the DLC film 3 improves the adhesiveness of the DLC film 3. This can realize a high impact resistance.

It is conventionally known to provide an intermediate layer such as a chromium layer in order to improve the adhesiveness of the DLC film to the surface of the component. However, the chromium layer is low in the adhesiveness to the surface hardened layer and so provision of the chromium layer on the surface hardened layer cannot realize a sufficiently high impact resistance. When the chromium layer is provided directly on the surface of the component without forming the surface hardened layer, a certain level of adhesiveness is surely obtained between the component main body and the chromium layer. However, in such a case, the component main body is soft due to the absence of a surface hardened layer. For this reason, the component main body is plastically deformed locally (due to an impression caused by a contaminating substance in the lubricant or as a result of sliding contact with an edge of another component). The DLC film cannot follow such deformation and is progressively delaminated or abraded. By providing the surface hardened layer 1b on the surface of the component main body 1a as in this preferred embodiment, such a local plastic deformation of the component main body 1a can be prevented. Unlike the conventional intermediate layer such as a chromium layer which has a low adhesiveness to the surface hardened layer 1b, the titanium layer 2 provided on the surface hardened layer 1b as in this preferred embodiment is highly adhesive to both of the surface hardened layer 1b and the DLC film 3 and thus realizes a sufficiently high impact resistance.

In this preferred embodiment, the titanium layer 2 is preferably provided between the surface hardened layer 1b and the DLC film 3. Instead of the titanium layer 2, a titanium alloy layer may be provided. The titanium alloy layer is also highly adhesive to both of the surface hardened layer 1b and the DLC film 3. Therefore, the titanium alloy layer provided between the surface hardened layer 1b and the DLC film 3 achieves the same effect. There is no specific limitation on the composition of the titanium alloy layer.

From the viewpoint of providing both of a high impact resistance and a high productivity, it is preferable that the titanium layer 2 (or the titanium alloy layer) has a thickness of about 100 nm or greater and about 1,500 nm or less, for example. When the thickness is less than about 100 nm, the DLC film 3 cannot have a sufficiently high adhesiveness and the impact resistance may not be improved to a sufficiently high level. When the thickness exceeds about 1,500 nm, the time required to form the titanium layer 2 (or the titanium alloy layer) (formation time) is excessively long and so the productivity may be decreased.

From the viewpoint of the production cost, it is preferable that the surface hardened layer 1b is a titanium oxide ($TiO_2$) layer. The formation of the titanium oxide layer can be conducted in the air and does not require any material gas unlike the formation of a titanium nitride layer or a titanium carbide layer. It is not necessary either to use a plasma CVD apparatus to form the titanium oxide layer. For these reasons, the titanium oxide layer can be produced at low cost.

FIG. 1 and FIG. 2 show the connecting rod 1 of one type called an "integral" type. The present invention is not limited to this, and is also preferably applicable to a divided type connecting rod in which the large end section is divided into two.

Now, a method for producing the connecting rod 1 in this preferred embodiment will be described.

First, the component main body 1a formed of titanium or a titanium alloy is prepared. The component main body 1a may be formed by any of various methods known as connecting rod production methods. For the titanium alloy, any of various compositions is usable. For example, a Ti-6Al-4V alloy or a β-type titanium alloy is preferably usable.

Next, the surface hardened layer 1b is formed on the surface of the component main body 1a. The surface hardened layer 1b does not need to be formed on the entire surface of the component main body 1a, and only needs to be formed on a surface of a portion which is required to have a high seizure resistance and a high abrasion resistance. More specifically, the surface hardened layer 1b only needs to be formed on a surface of at least a portion of the component main body 1a. Preferably, the surface hardened layer 1b has a thickness of about 50 μm or greater and about 150 μm or less, for example. When the thickness is less than about 50 μm, abrasion or seizure may occur due to the shortage of slidability. When the thickness exceeds about 150 μm, the fatigue strength is decreased by the thick embrittled layer and the surface hardened layer 1b may be destroyed.

In the case where the surface hardened layer 1b is a titanium oxide layer, the surface of the component main body 1a is treated with oxidation. Oxidation is performed by, for example, heating the component main body 1a in an air atmosphere to 600° C. or higher for 30 minutes to 8 hours. In the case where the surface hardened layer 1b is a titanium nitride layer, the surface of the component main body 1a is treated with nitrification. In the case where the surface hardened layer 1b is a titanium carbide layer, the surface of the component main body 1a is treated with carbonization.

Next, the titanium layer 2 is formed on the surface hardened layer 1b. The titanium layer 2 may be formed by, for example, sputtering. As described above, a titanium alloy layer may be formed instead of the titanium layer 2. For the reason described above, it is preferable that the titanium layer 2 (or the titanium alloy layer) is formed to have a thickness of about 100 nm or greater and about 1,500 nm or less, for example.

Then, the DLC film 3 is formed on the titanium layer 2. The DLC film 3 may be formed by CVD (chemical vapor deposition) or PVD (physical vapor deposition). As the CVD, plasma CVD is preferably usable, for example. As the PVD, sputtering or ion plating is preferably usable, for example. Preferably, the DLC film 3 has a thickness of about 1 μm or greater and about 6 μm or less, for example. When the thickness is less than about 1 μm, abrasion may occur due to the shortage of abrasion resistance. When the thickness exceeds about 6 μm, the DLC film 3 may be delaminated due to the shortage of adhesiveness.

In this manner, the connecting rod 1 in this preferred embodiment can be produced.

When a titanium oxide layer is formed as the surface hardened layer 1b, it is preferable to remove an outermost portion of the titanium oxide layer before the step of forming the titanium layer 2 (or the titanium alloy layer). The outermost portion of the titanium oxide layer is a brittle portion called an "oxide scale". By removing this portion, the adhesiveness of the titanium layer 2 (or the titanium alloy layer) to the surface hardened layer (titanium oxide layer) 1b can be improved.

For removing the oxide scale, from the viewpoint of improving the adhesiveness of the titanium layer 2 to a sufficiently high level, it is preferable that the Vickers hardness HV (0.1) of the post-removal outermost surface of the titanium oxide layer is 400 or greater, for example. Where the surface of the titanium oxide layer has highly convexed and concaved portions, the adhesiveness may be decreased. Therefore, it is preferable that after the oxide scale is removed, the titanium oxide layer has a surface roughness of about 1.6 μm or less as the maximum height Rz and about 3.2 μm or less as the ten-point average roughness $Rz_{JIS}$, for example.

Preferably, the oxide scale is removed by barrel polishing. When the removal of the oxide scale is performed by barrel polishing, the surface roughness is easily made low.

A connecting rod 1 in this preferred embodiment was actually produced as described below (example). As a comparative example, a connecting rod having the same structure as that of the connecting rod 1 in this preferred embodiment except including a chromium layer and a chromium nitride layer instead of the titanium layer 2 was produced. Regarding these connecting rods, the adhesiveness of the DLC film 3 was evaluated. The results will be described.

EXAMPLE

First, the component main body 1b formed of a titanium alloy (specifically, Ti-6A1-4V alloy) was prepared, and was degreased. Next, the component main body 1b was heated to 800° C. for 60 minutes in an air atmosphere to form a titanium oxide layer as the surface hardened layer 1b. The thickness of the obtained titanium oxide layer was 60 μm.

Then, the outermost portion (oxide scale) of the titanium oxide layer was removed by centrifugal barrel polishing. Specifically, a portion from the outermost surface to a depth of 8 μm was removed. By this polishing, a rough area (an area having many convex and concave portions) of the titanium oxide layer was also removed. As a result, the maximum height Rz of the surface was less than 1.6 μm.

Next, the component main body 1a deprived of the oxide scale was introduced into a chamber of a sputtering apparatus. While the pressure inside the chamber was decreased down to 0.4 Pa, the inside of the chamber was heated by a heater in order to realize a temperature of 200° C. In this state, argon gas was introduced into the chamber, and the surface of the titanium oxide layer was sputtered for 30 minutes to perform ion bombardment. Thus, the surface was activated and also washed.

Next, sputtering was performed for 40 minutes using pure titanium as a target to form the titanium layer 2 having a thickness of 700 nm on the titanium oxide layer. Then, plasma CVD was performed in a chamber of a plasma CVD apparatus at a pressure of 1 Pa in an atmosphere of hydrocarbon gas to form the DLC film 3 having a thickness of 2300 nm on the titanium layer 2.

Comparative Example

A connecting rod was produced in the same manner as in the example except that a chromium layer having a thickness of 300 nm and a chromium nitride layer having a thickness of 400 nm were formed in this order instead of the titanium layer 2. The chromium layer was formed by sputtering using chromium as a target. The chromium nitride layer was formed by sputtering in the state where nitrogen gas was introduced.

Adhesiveness Evaluation Test

Figure 4:
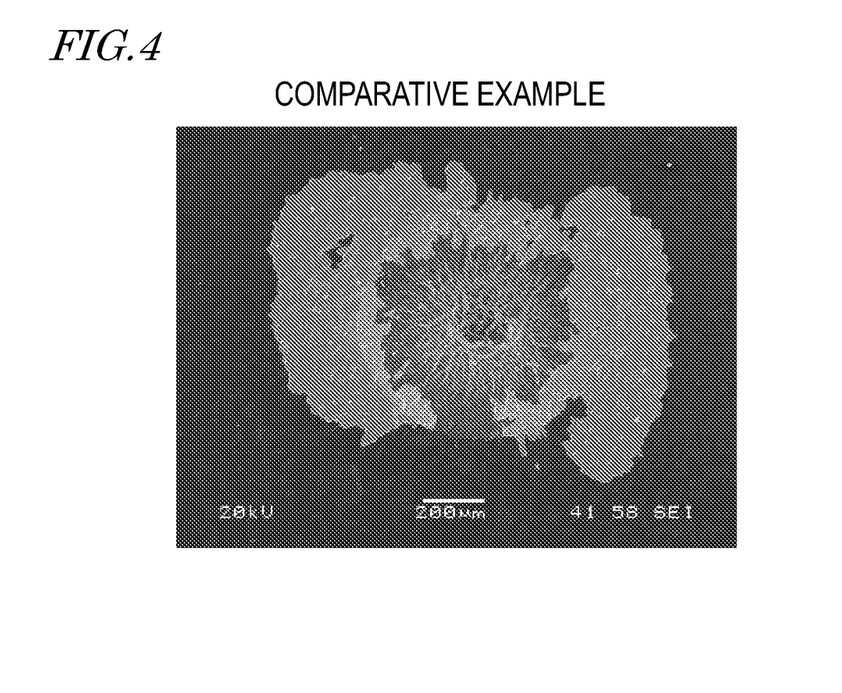
FIG. 4 shows a microphotograph showing a surface of a connecting rod in a comparative example after a Rockwell impress test.
Figure 5:
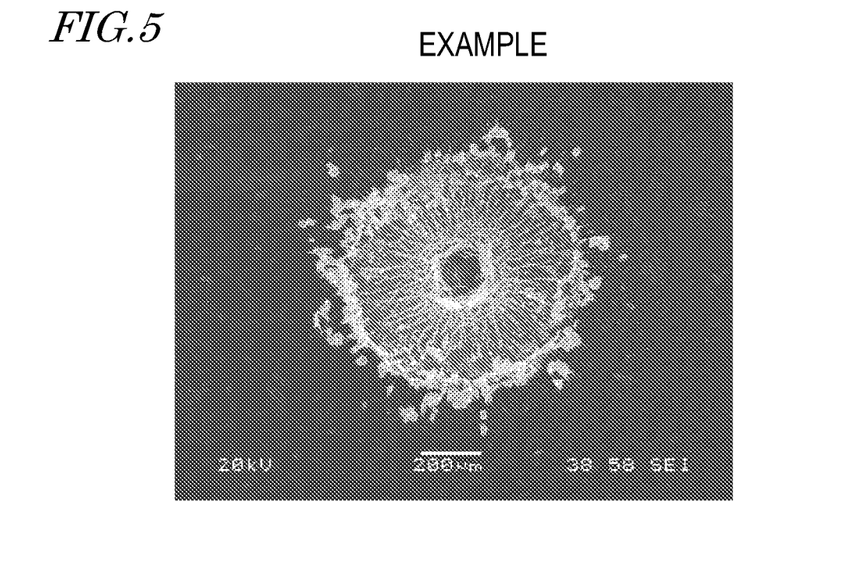
FIG. 5 shows a microphotograph showing a surface of a connecting rod 1 in an example according to a preferred embodiment of the present invention after a Rockwell impress test.

A Rockwell impression test (C scale) was performed on the connecting rods of the example and the comparative example. Specifically, an indenter was driven into the surface of each of the connecting rods of the example and the comparative example, and the delaminating state of the DLC film was observed. FIG. 4 shows a microphotograph of a surface of the connecting rod of the comparative example, and FIG. 5 shows a microphotograph of a surface of the connecting rod 1 of the example.

As shown in FIG. 4, in the connecting rod of the comparative example, the DLC film is delaminated in a wide area around the impression. This indicates that the adhesiveness of the DLC film is low. By contrast, as shown in FIG. 5, in the connecting rod of the example, the DLC film is delaminated substantially only at the impression, specifically, only in an area subjected to a large plastic deformation. This indicates that the adhesiveness of the DLC film is very high.

Figure 6:
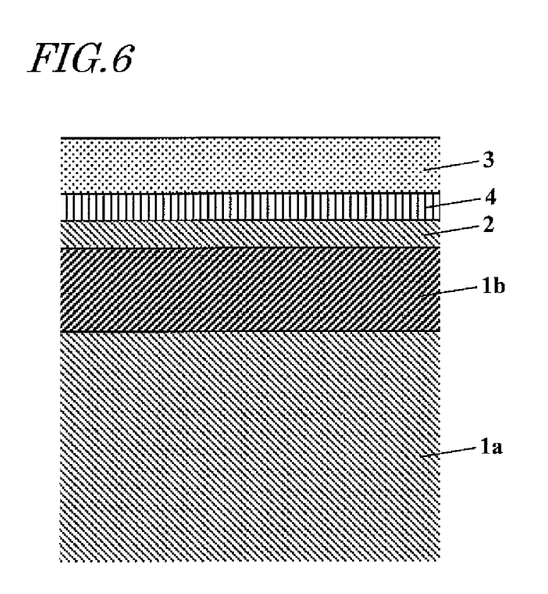
FIG. 6 is a cross-sectional view schematically showing another stacking structure formed at a slide contact portion of the connecting rod 1 according to a preferred embodiment of the present invention.

As described above, by providing the titanium layer 2 between the surface hardened layer 1b and the DLC film 3, the adhesiveness of the DLC film 3 is improved. FIG. 3 shows a structure in which only the titanium layer 2 is provided between the surface hardened layer 1b and the DLC film 3, as an example. As shown in FIG. 6, an intermediate layer 4 may be provided between the titanium layer 2 and the DLC film 3. The intermediate layer is, for example, a chromium layer, a silicon layer or a tungsten layer. The intermediate layer 4 may be a layer in which a metal element or a non-metal element and DLC are present in mixture and the ratio thereof changes in a thickness direction (referred to as a "DLC gradient layer"). The DLC gradient layer is, for example, a tungsten-DLC film or a silicon-DLC film.

The intermediate layer 4 described above can gradually change physical properties such as the Young's modulus, hardness and the like of the layers above and below the intermediate layer 4. The intermediate layer 4 can also alleviate the residual stress. Therefore, by providing the intermediate layer 4, the adhesiveness of the DLC film 3 can be further improved and thus a still higher impact resistance can be realized. FIG. 6 shows a structure in which one intermediate layer 4 between the titanium layer 2 and the DLC film 3. Alternatively, a plurality of (i.e., two or more) intermediate layers 4 may be provided. Also, the plurality of intermediate layers 4 may be formed of different materials from one another. For example, the plurality of intermediate layers 4 may form a composite layer of various layers mentioned above.

A structure with no intermediate layer 4, that is, a structure having only the titanium layer 2 (or the titanium alloy layer) between the surface hardened layer 1b and the DLC film 3 provides an advantage of simplifying the production process of the sliding component (here, the connecting rod) and reducing the time and cost of production.

Figure 7:
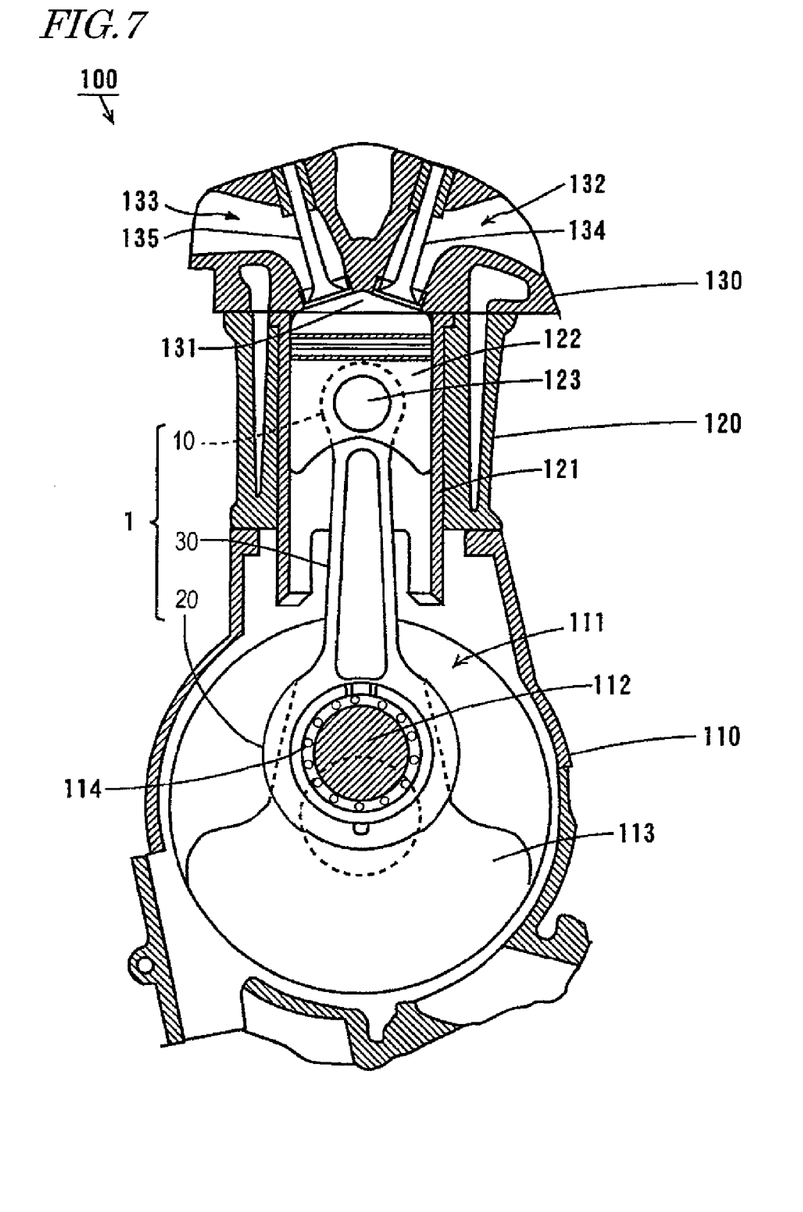
FIG. 7 is a cross-sectional view schematically showing an internal combustion engine including the connecting rod 1 according to a preferred embodiment of the present invention.

The connecting rod 1 in this preferred embodiment is preferably usable for various types of internal combustion engines, for example. FIG. 7 shows an internal combustion engine 100 including the connecting rod 1 in this preferred embodiment. The internal combustion engine 100 includes a crank case 110, a cylinder block 120 and a cylinder head 130.

A crank shaft 111 is accommodated in the crank case 110. The crank shaft 111 includes a crankpin 112 and a crank web 113.

The cylinder block 120 is provided on the crank case 110. A cylinder sleeve 121 of a cylindrical shape is fit into the cylinder block 120, and a piston 122 is provided to be movable in a reciprocating manner in the cylinder sleeve 121.

The cylinder head 130 is provided on the cylinder block 120. The cylinder head 130 defines a combustion chamber 131 together with the piston 122 and the cylinder sleeve 121 in the cylinder block 120. The cylinder head 130 includes an intake port 132 and an exhaust port 133. In the intake port 132, an intake valve 134 arranged to supply mixed gas into the combustion chamber 131 is provided. In the exhaust port 133, an exhaust valve 135 arranged to discharge gas from the combustion chamber 131 is provided.

The piston 122 and the crank shaft 111 are connected to each other by the connecting rod 1. Specifically, a piston pin 123 of the piston 122 is inserted into the through-hole of the small end section 10 of the connecting rod 1, and the crankpin 112 of the crank shaft 111 is inserted into the through-hole of the large end section 20. As a result of this structure, the piston 122 and the crank shaft 111 are connected to each other. Between the inner circumferential surface of the through-hole of the large end section 20 and the crankpin 112, roller bearings 114 are provided.

Use of the connecting rod 1 in this preferred embodiment including the component main body 1a formed of titanium or a titanium alloy (i.e., the lightweight connecting rod 1) can decrease the weight of the internal combustion engine 100. Use of the lightweight connecting rod 1 in this preferred embodiment can decrease the inertial force, and so the vibration of the internal combustion engine 100 can be reduced to improve the response. In addition, because the coefficient of friction of the DLC film 3 is low, use of the connecting rod 1 in this preferred embodiment can reduce the friction loss. This can improve the fuel efficiency and also increase the output. Moreover, the DLC film 3 is not very invasive to other components against which the connecting rod 1 is slidable. Therefore, use of the connecting rod 1 in this preferred embodiment can decrease the wear of such other components and thus improve the durability of the internal combustion engine 100.

Figure 8:
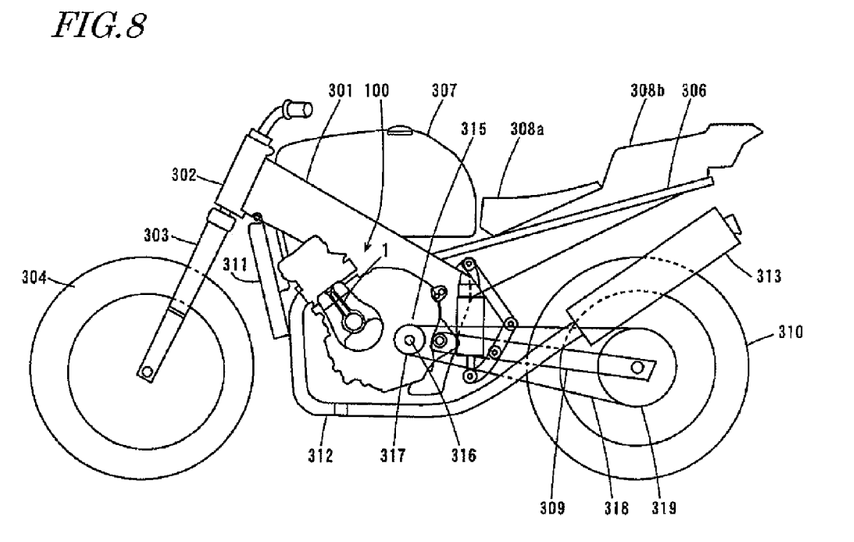
FIG. 8 is a side view schematically showing a motorcycle including the internal combustion engine shown in FIG. 7.

The internal combustion engine 100 including the connecting rod 1 in this preferred embodiment is preferably usable for various transportation vehicles including a motorcycle. FIG. 8 shows a motorcycle including the internal combustion engine 100 shown in FIG. 7.

In the motorcycle shown in FIG. 8, a head pipe 302 is provided at a front end of a main body frame 301. To the head pipe 302, a front fork 303 is attached so as to be swingable in a left/right direction of the vehicle. At a bottom end of the front fork 303, a front wheel 304 is rotatably supported.

A seat rail 306 is attached so as to extend rearward from a top portion of a rear end of the main body frame 301. On the main body frame 301, a fuel tank 307 is provided. On the seat rail 306, a main seat 308a and a tandem seat 308b are provided.

At the rear end of the main body frame 301, a rear arm 309 extending rearward is provided. At a rear end of the rear arm 309, a rear wheel 310 is rotatably supported.

At a center of the main body frame 301, the internal combustion engine 100 is held. Forward to the internal combustion engine 100, a radiator 311 is provided. To the exhaust port of the internal combustion engine 100, an exhaust pipe 312 is connected. At a rear end of the exhaust pipe 312, a muffler 313 is attached.

To the internal combustion engine 100, a transmission 315 is connected. To an output shaft 316 of the transmission 315, a driving sprocket 317 is attached. The driving sprocket 317 is connected to a rear wheel sprocket 319 of the rear wheel 310 via a chain 318. The transmission 315 and the chain 318 function as a transmission mechanism to transmit the power generated by the internal combustion engine 100 to the driving wheel.

In this preferred embodiment, the connecting rod 1 is described as an example. The present invention is not limited to the connecting rod 1, and is widely usable for any type of sliding components for an internal combustion engine. For example, the present invention is preferably applicable also to an engine valve and a valve lifter.

According to various preferred embodiments of the present invention, the adhesiveness of a DLC film provided on a surface of a sliding component formed of titanium or a titanium alloy is improved to realize a high impact resistance. An internal combustion engine including a sliding component according to a preferred embodiment of the present invention is preferably usable for various transportation vehicles including automobiles, motorbikes, buses, trucks, tractors, aircrafts, motorboats, and construction work vehicles, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

This application is based on Japanese Patent Applications No. 2009-110608 filed on Apr. 30, 2009, the entire contents of which are hereby incorporated by reference.

What is claimed is:

1. A sliding component for an internal combustion engine, the sliding component comprising:
    a component main body made of titanium or a titanium alloy;
    a surface hardened layer provided on a surface of the component main body;
    a diamond-like carbon film provided on the surface hardened layer; and
    a titanium layer or a titanium alloy layer provided between the surface hardened layer and the diamond-like carbon film; wherein
    the surface hardened layer is a titanium oxide layer.

2. The sliding component for an internal combustion engine of claim 1, wherein the titanium layer or the titanium alloy layer has a thickness of about 100 nm or greater and about 1,500 nm or less.

3. The sliding component for an internal combustion engine of claim 1, wherein the diamond-like carbon film has a thickness of about 1 µm or greater and about 6 µm or less.

4. The sliding component for an internal combustion engine of claim 1, further comprising at least one intermediate layer provided between the titanium layer or the titanium alloy layer and the diamond-like carbon film.

5. The sliding component for an internal combustion engine of claim 1, wherein the sliding component is a connecting rod comprising:
    a small end section;

a large end section; and
a connection section arranged to connect the small end section and the large end section to each other.

6. The sliding component for an internal combustion engine of claim 5, wherein the surface hardened layer, the titanium layer or the titanium alloy layer, and the diamond-like carbon film are provided on an inner circumferential surface of at least one of the small end section and the large end section.

7. The sliding component for an internal combustion engine of claim 5, wherein the surface hardened layer, the titanium layer or the titanium alloy layer, and the diamond-like carbon film are provided on a thrust surface of the large end section.

8. An internal combustion engine comprising the sliding component for an internal combustion engine of claim 1.

9. A transportation vehicle comprising the internal combustion engine of claim 8.

10. A sliding component for an internal combustion engine, the sliding component comprising:
    a component main body made of titanium or a titanium alloy;
    a surface hardened layer provided on a surface of the component main body;
    a diamond-like carbon film provided on the surface hardened layer; and
    a titanium layer or a titanium alloy layer provided between the surface hardened layer and the diamond-like carbon film; wherein
    the surface hardened layer has a thickness of about 50 82 m or greater and about 150 μm or less.

11. A method for producing a sliding component for an internal combustion engine, the method comprising the steps of:
    preparing a component main body formed of titanium or a titanium alloy;
    forming a surface hardened layer on a surface of the component main body;
    forming a titanium layer or a titanium alloy layer on the surface hardened layer; and
    forming a diamond-like carbon film on the titanium layer or the titanium alloy layer; wherein
    in the step of forming the surface hardened layer, the surface of the component main body is oxidized to form a titanium oxide layer as the surface hardened layer.

12. The method for producing a sliding component for an internal combustion engine of claim 11, wherein in the step of forming the titanium layer or the titanium alloy layer, the titanium layer or the titanium alloy layer is formed to have a thickness of about 100 nm or greater and about 1,500 nm or less.

13. The method for producing a sliding component for an internal combustion engine of claim 11, further comprising the step of removing an outermost portion of the titanium oxide layer before the step of forming the titanium layer or the titanium alloy layer.

* * * * *